United States Patent
Ryan et al.

(10) Patent No.: US 8,592,312 B2
(45) Date of Patent: Nov. 26, 2013

(54) METHOD FOR DEPOSITING A CONDUCTIVE CAPPING LAYER ON METAL LINES

(75) Inventors: E. Todd Ryan, Wappingers Falls, NY (US); John A. Iacoponi, Wappingers Falls, NY (US)

(73) Assignee: GLOBALFOUNDRIES Inc., Grand Cayman (KY)

(*) Notice: Subject to any disclaimer, the term of this patent is extended or adjusted under 35 U.S.C. 154(b) by 792 days.

(21) Appl. No.: 11/811,418

(22) Filed: Jun. 7, 2007

(65) Prior Publication Data

US 2008/0305617 A1 Dec. 11, 2008

(51) Int. Cl.
 *H01L 21/44* (2006.01)
(52) U.S. Cl.
 USPC ........... 438/678; 438/674; 438/676; 438/677; 438/641; 257/E21.294; 257/E21.295; 257/E21.477; 257/E21.479; 257/E21.495
(58) Field of Classification Search
 USPC .......... 427/436; 438/629, 637, 687, 674, 676, 438/677, 678, 641; 257/E21.294, E21.295, 257/E21.477, E21.479, E21.495
 See application file for complete search history.

(56) References Cited

U.S. PATENT DOCUMENTS

| | | | |
|---|---|---|---|
| 5,817,367 A * | 10/1998 | Chun et al. | 427/250 |
| 6,696,133 B2 * | 2/2004 | Ueno et al. | 428/138 |
| 2002/0008320 A1 * | 1/2002 | Kuwabara et al. | 257/738 |
| 2002/0164421 A1 * | 11/2002 | Chiang et al. | 427/248.1 |
| 2003/0003711 A1 * | 1/2003 | Modak | 438/629 |
| 2005/0104216 A1 * | 5/2005 | Cabral et al. | 257/758 |
| 2006/0249392 A1 * | 11/2006 | Chen et al. | 205/477 |
| 2007/0063348 A1 * | 3/2007 | Yang et al. | 257/751 |

OTHER PUBLICATIONS

Quirk, Michael and Julian Serda, "Semiconductor Manufacturing Technology", 2001, Prentice-Hall, Inc., Upper Saddle River, New Jersey (p. 323-325).*

* cited by examiner

*Primary Examiner* — Kimberly Rizkallah
*Assistant Examiner* — Maria Ligai
(74) *Attorney, Agent, or Firm* — Farjami & Farjami LLP (57) ABSTRACT

In one disclosed embodiment, the present method for depositing a conductive capping layer on metal lines comprises forming metal lines on a dielectric layer, applying a voltage to the metal lines, and depositing the conductive capping layer on the metal lines. The applied voltage increases the selectivity of the deposition process used, thereby preventing the conductive capping layer from causing a short between the metal lines. The conductive capping layer may be deposited through electroplating, electrolessly, by atomic layer deposition (ALD), or by chemical vapor deposition (CVD), for example. In one embodiment, the present method is utilized to fabricate a semiconductor wafer. In one embodiment, the metal lines comprise copper lines, while the conductive capping layer may comprise tantalum or cobalt. The present method enables deposition of a capping layer having high electromigration resistance.

20 Claims, 7 Drawing Sheets

METHOD FOR DEPOSITING A CONDUCTIVE CAPPING LAYER ON METAL LINES

TECHNICAL FIELD

The present invention is generally in the field of semiconductor device fabrication. More particularly, the invention is in the field of fabrication of metal lines over a semiconductor wafer.

BACKGROUND ART

Metal lines formed over a semiconductor wafer typically require a protective capping layer to prevent oxidation. One conventional approach to providing such protection utilizes a dielectric capping layer. Another approach utilizes a metal capping layer because of its stronger adherence to the metal lines it covers. Formation of a metal capping layer on metal lines requires use of a selective deposition process to avoid shorting between the lines caused by an accumulation of the metal capping layer between the metal lines. However, because existing methods for selective deposition are not entirely selective, their use may still result in some accumulation of metal capping material between the metal lines.

Although the deficiencies associated with the approaches to providing a protective capping layer for metal lines alluded to above are manageable for larger line dimensions and interlineal spacing, as circuits move to ever smaller dimensions, those deficiencies become more critical. In the case of dielectric capping layers, which exhibit lower metal line adhesion than metal capping layers, the higher current densities resulting from narrower lines may result in impermissibly high levels of electromigration along the dielectric capping layer/metal line interface. Use of a metal capping layer, on the other hand, avoids this electromigration problem. However, at higher line densities, the accumulation of capping material between lines produced by conventional selective deposition processes can cause shorting between adjacent metal lines and can degrade the reliability of the integrated circuit.

SUMMARY

A method for depositing a conductive capping layer on metal lines, substantially as shown in and/or described in connection with at least one of the figures, as set forth more completely in the claims.

DETAILED DESCRIPTION OF THE INVENTION

The present invention is directed to a method for depositing a conductive capping layer on metal lines. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention. The specific details not described in the present application are within the knowledge of a person of ordinary skill in the art.

The drawings in the present application and their accompanying detailed description are directed to merely exemplary embodiments of the invention. To maintain brevity, other embodiments of the present invention, which use the principles of the present invention, are not specifically described in the present application and are not specifically illustrated by the present drawings.

Figure 1:
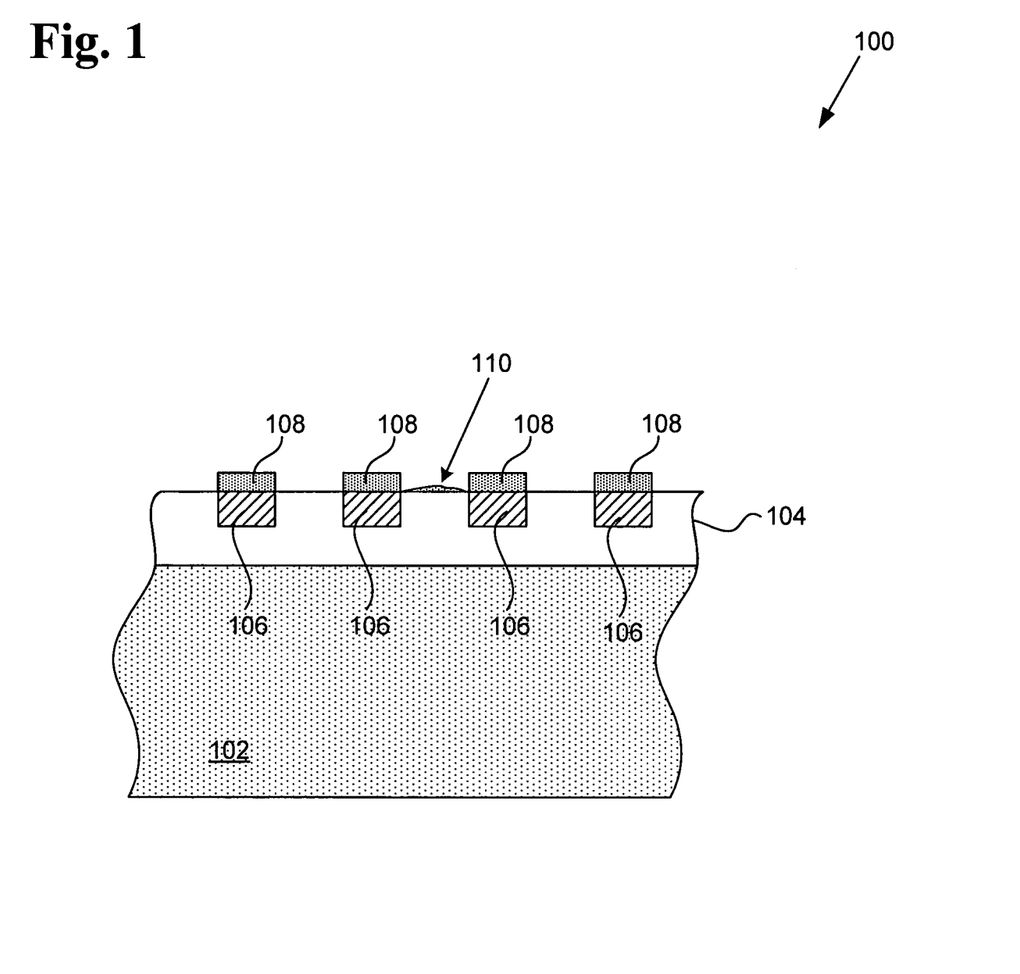
FIG. 1 shows a cross-sectional view of metal lines formed over a semiconductor wafer, depicting a problem resolved by an embodiment of the present invention.

FIG. 1 shows the results of a conventional approach to selectively depositing a metal capping layer on metal lines formed over a semiconductor wafer. It should be noted that FIG. 1 is for the purpose of providing an overview, and elements shown in FIG. 1 are conceptual representation of physical and electrical elements, and are thus not intended to show dimensions or relative sizes or scale. FIG. 1 shows a cross-sectional view of metal lines formed over a semiconductor wafer. Structure 100 in FIG. 1 includes semiconductor wafer 102, dielectric layer 104, metal lines 106, metal capping layer 108, and capping material accumulation 110 (also referred to as "residue" 110 in the art).

In a conventional method for forming metal capping layer 108 over metal lines 106, the metal capping layer might be selectively deposited in an electroless process. While partially selective, conventional electroless deposition methods are not exclusive. Consequently, as metal capping material is preferentially deposited to form metal capping layer 108 on metal lines 106, some metal capping material can be concurrently deposited in the regions between metal lines 106, creating capping material accumulation 110. The presence of capping material accumulation 110 may be fairly nominal, and in circuit geometry regimes of even a few years ago, would not have threatened circuit integrity. In the higher line density environments associated with the ever smaller circuits being fabricated today, however, capping material accumulation 110 can be sufficient to introduce leakage currents between metal lines 106, and in some cases, can cause shorting between adjacent metal lines.

Figure 2:
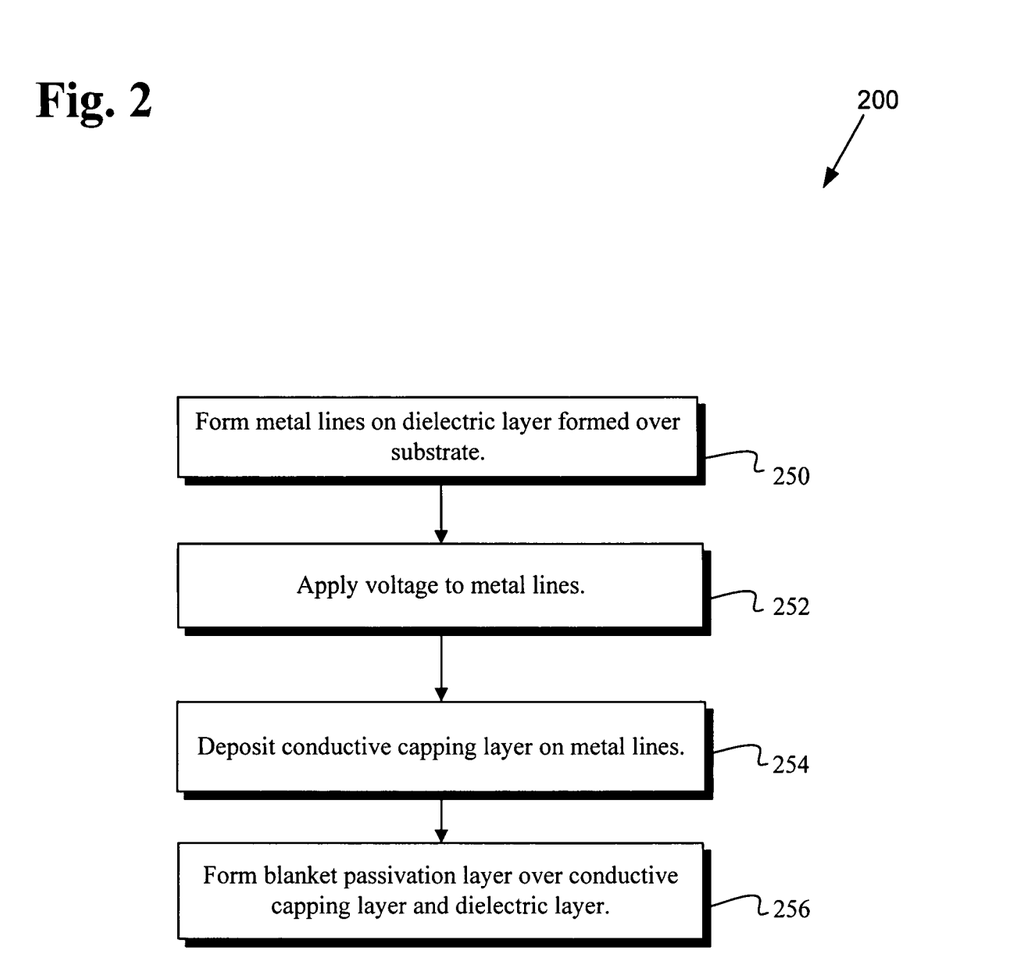
FIG. 2 shows a flowchart of an exemplary method to implement an embodiment of the present invention.

FIG. 2 shows a flowchart illustrating an exemplary method for depositing a conductive capping layer on metal lines, according to an embodiment of the present invention. Certain details and features have been left out of flowchart 200 that are apparent to a person of ordinary skill in the art. For example, a step may comprise one or more substeps or may involve specialized equipment or materials, as known in the art. While steps 250 through 256 indicated in flowchart 200 are sufficient to describe one embodiment of the present invention, other embodiments of the invention may utilize steps different from those shown in flowchart 200.

Moreover, structures 350 through 356 in FIGS. 3A through 3D illustrate the result of performing steps 250 through 256 of flowchart 100, respectively. For example, structure 350 shows a semiconductor structure after processing step 250, structure 352 shows structure 350 after the processing of step 252, structure 354 shows structure 352 after the processing of step 254, and so forth.

Figure 3A:
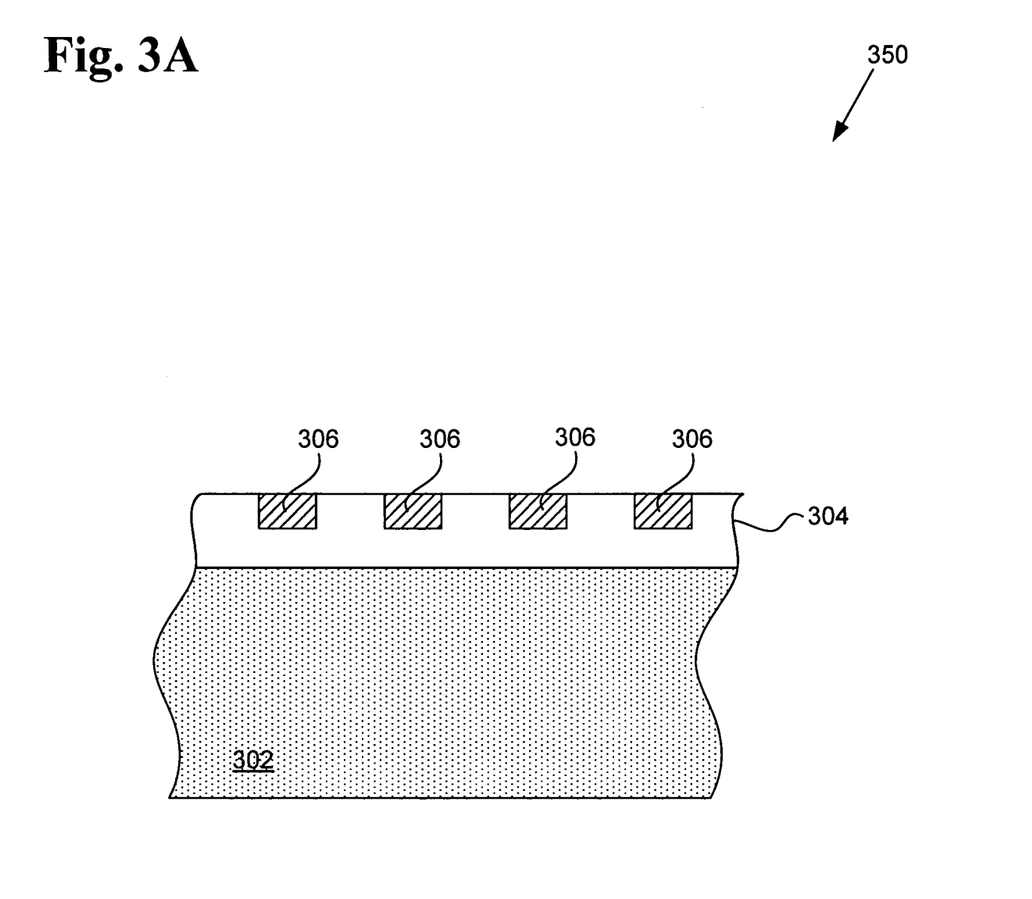
FIG. 3A shows an exemplary structure corresponding to an initial step in the flowchart of FIG. 2.

Referring now to step 250 in FIG. 2 and structure 350 in FIG. 3A, step 250 of flowchart 200 comprises formation of metal lines 306 on dielectric layer 304, formed over substrate 302. Substrate 302 can comprise, for example, a semiconductor wafer. Dielectric layer 304 formed over substrate 302 may comprise silicon dioxide or silicon nitride, for example. In other embodiments, there may be additional material layers between substrate 302 and dielectric layer 304. In the present embodiment, metal lines 306 shown in FIG. 3A can comprise copper. In other embodiments, metal lines 306 can comprise different metals including, but not limited too, silver, gold, or platinum. Metal lines 306 can be formed on dielectric layer 304 using any suitable process, as known in the art.

Figure 3B:
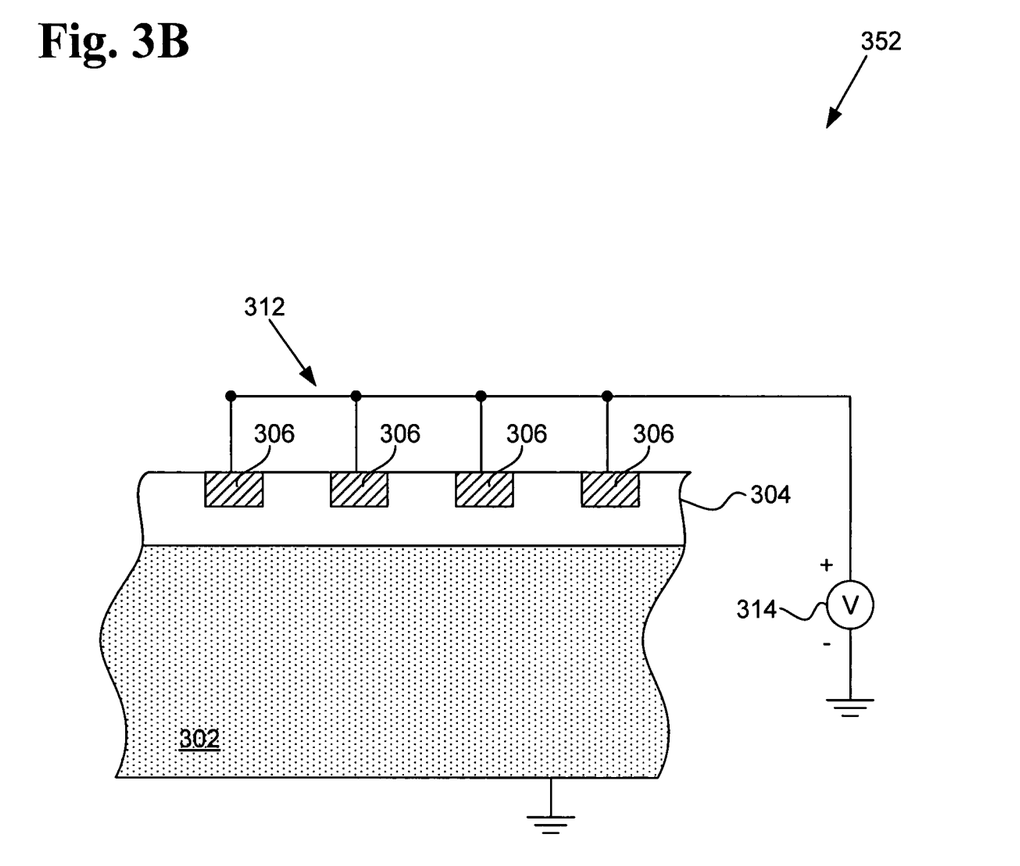
FIG. 3B shows an exemplary structure and diagram corresponding to an intermediate step in the flowchart of FIG. 2.

At step 252 in FIG. 2 and structure and diagram 352 in FIG. 3B, a voltage is applied to metal lines 306. In the present embodiment, voltage source 314 provides a voltage, which is coupled to each of metal lines 306, while substrate 302 is grounded. Voltage source 314 can provide, for example, a steady DC voltage, a "pulsed DC voltage" (i.e. a DC voltage that is switched on and off at a pre-determined frequency). Moreover, the value of the voltage in the pulsed DC voltage mode need not be constant with every pulse, and may even include positive and/or negative pulses, or combinations thereof. Other variations in the voltage versus time profile (i.e. voltage waveforms) of voltage source 314 can also be used.

In one embodiment, electrodes attached to metal lines 306 at edges (not shown in FIG. 3B) of substrate 302, can provide voltage 312. Presence of voltage 312 on metal lines 306, as shown in FIG. 3B, increases the selectivity of a selective deposition process utilized to form conductive capping layers over metal lines 306 so as to reduce accumulation of conductive capping material between metal lines 306.

Figure 3C:
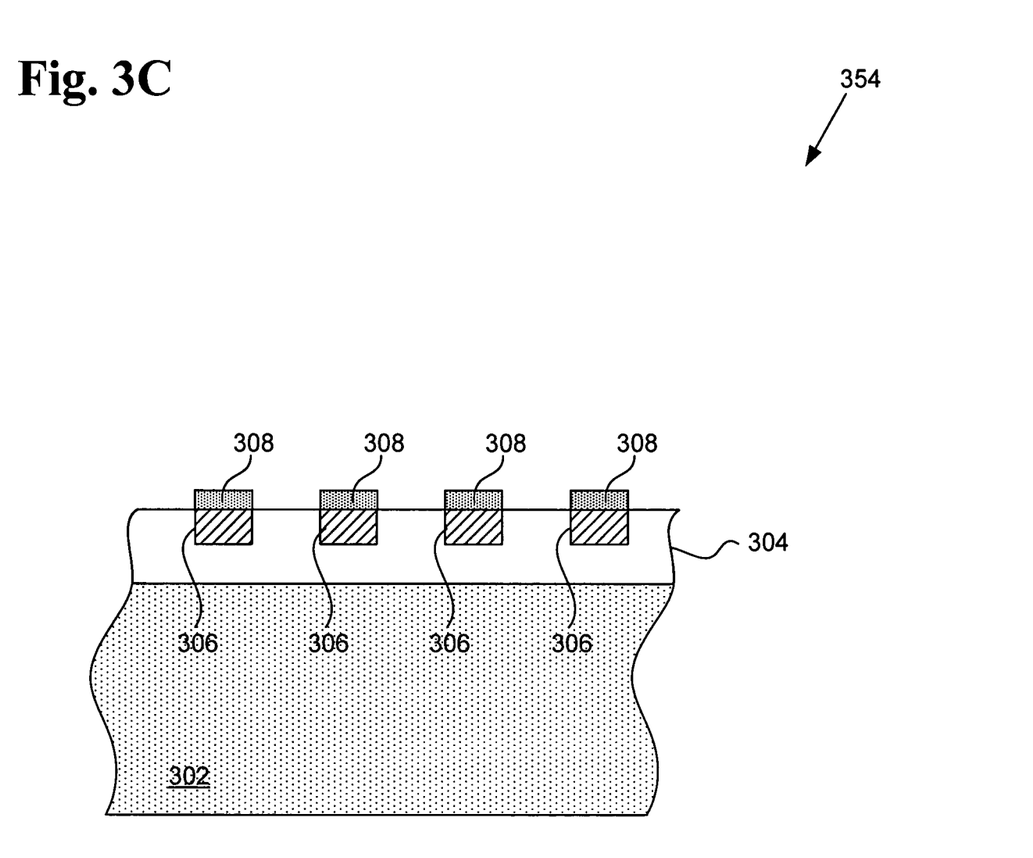
FIG. 3C shows an exemplary structure corresponding to an intermediate step in the flowchart of FIG. 2.

Continuing with step 254 of flowchart 200 and structure 354 in FIG. 3C, step 254 of flowchart 200 comprises depositing conductive capping layer 308 on metal lines 306. As shown in FIG. 3C, enhancement of the selectivity of a particular deposition process, due to a voltage provided on metal lines 306 during deposition, results in formation of conductive capping layer 308 with little or no corresponding accumulation of conductive material between metal lines 306. Conductive capping layer 308 may comprise a metal, for example, cobalt or tantalum, or a nonmetallic conductive material.

Deposition of conductive capping layer 308 can be performed using a forced electroplating process, an electroless process, a chemically mediated electroless process, an atomic layer deposition (ALD) process, a chemical vapor deposition (CVD) process, or a physical vapor deposition (PVD) process, as examples. Regardless of the specific deposition process utilized, biasing of metal lines 306 through application of voltage at step 252 of flowchart 200, enhances selective deposition of the conductive capping layer. Due to the preferential accumulation of conductive capping layer 308 on metal lines 306 resulting from the present method, conductive capping layer 308 can be formed having a thickness of from 5 to 20 nanometers, for example, with little or no accumulation of conductive capping material between metal lines 306.

As a result of the process steps shown in FIGS. 3B and 3C, the present invention enables formation of conductive capping layer 308 over metal lines 306, while avoiding the drawbacks associated with protective capping in conventional approaches. Use of conductive capping layer 308 provides strong adhesion to metal lines 306, thereby preventing the electromigration problem present when dielectric capping layers are used. Application of voltage 312 enhances the selectivity of the deposition process utilized in forming conductive capping layer 308, and in so doing avoids the leakage current and shorting problems produced by capping material accumulation 110 plaguing conventional methods for providing electromigration resistant capping layers, as shown in FIG. 1.

Figure 3D:
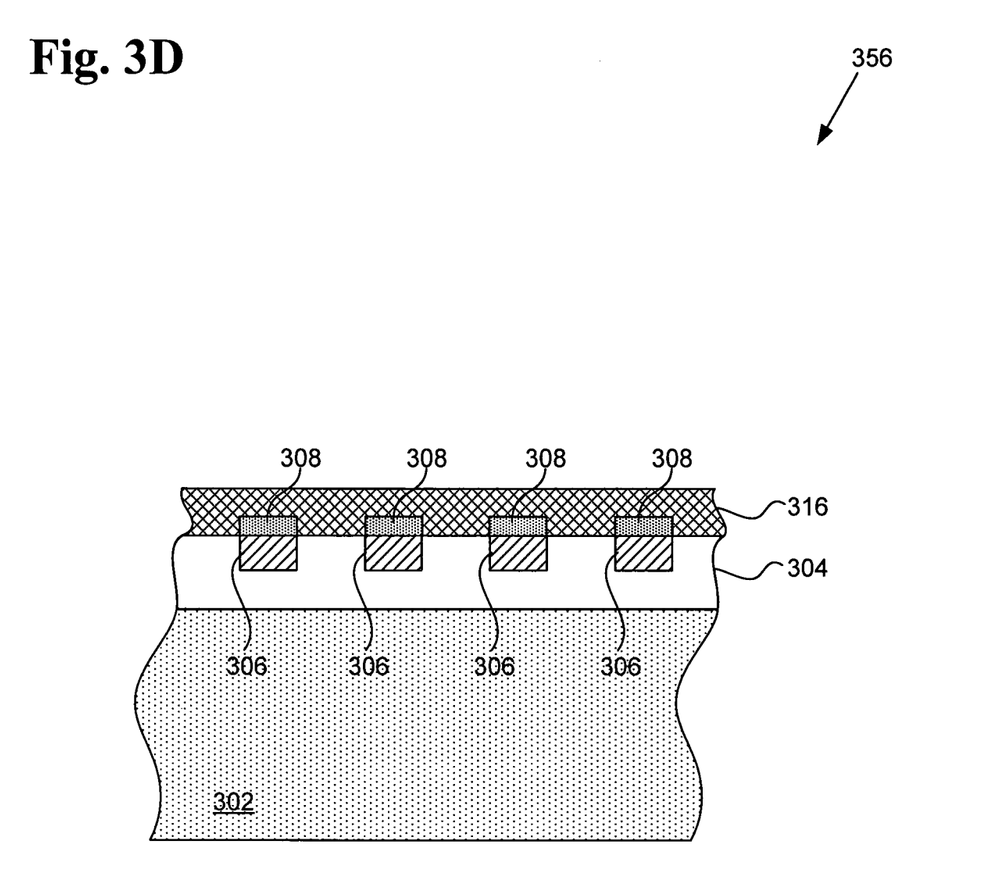
FIG. 3D shows an exemplary structure corresponding to a final step in the flowchart of FIG. 2.

Continuing with step 256 of flowchart 200 and structure 356 in FIG. 3D, a blanket passivation layer is formed over the conductive capping layer and the dielectric layer on which the metal lines are formed. As shown in FIG. 3D, blanket passivation layer 316 is formed over conductive capping layer 308 and dielectric layer 304. As a result of implementation of the present invention's method, blanket passivation layer 316 may be formed from a material selected to optimize subsequent fabrication steps in the processing of substrate 302. For example, blanket passivation layer 316 may be formed from a material selected to have a low dielectric constant, i.e., a low-k dielectric material, and thereby reduced capacitance, or from a material chosen for etch selectivity. This flexibility in selecting blanket passivation layer 316 results from formation of conductive capping layer 308 through the present method's enhanced selective deposition of a conductive capping layer on metal lines 306.

Flexibility in choice of a blanket passivation layer presents a significant advantage over conventional approaches utilizing dielectric capping layers. The weaker adhesion between a dielectric capping layer and metal lines, at their interface, makes electromigration effects of overriding importance in selecting a blanket passivation layer, even at the cost of higher capacitance characteristics or less desirable etch selectivity. By contrast, due to the strong adhesion of conductive capping layers 308 to metal lines 306, and the resulting high resistance to electromigration along their interface in the present embodiment, blanket passivation layer 316 can be selected independently of concerns about its effect on electromigration along metal lines 306.

As a result of the method for depositing a conductive capping layer on metal lines, described in the exemplary embodiments set forth in the present application and shown by flowchart 200 in FIG. 2, a semiconductor wafer having one or more semiconductor dies can be fabricated. In a subsequent step (not shown on flowchart 200) the semiconductor dies can be separated from the semiconductor wafer in a dicing process after semiconductor wafer fabrication has been completed. The fabricated and separated semiconductor die, which is fabricated by using the present invention's method for depositing a conductive capping layer on metal lines, can be mounted on a circuit board, for example. The diced and separate dies can be packaged, i.e. can be enclosed and/or sealed in suitable semiconductor packages, as known in the art.

Figure 4:
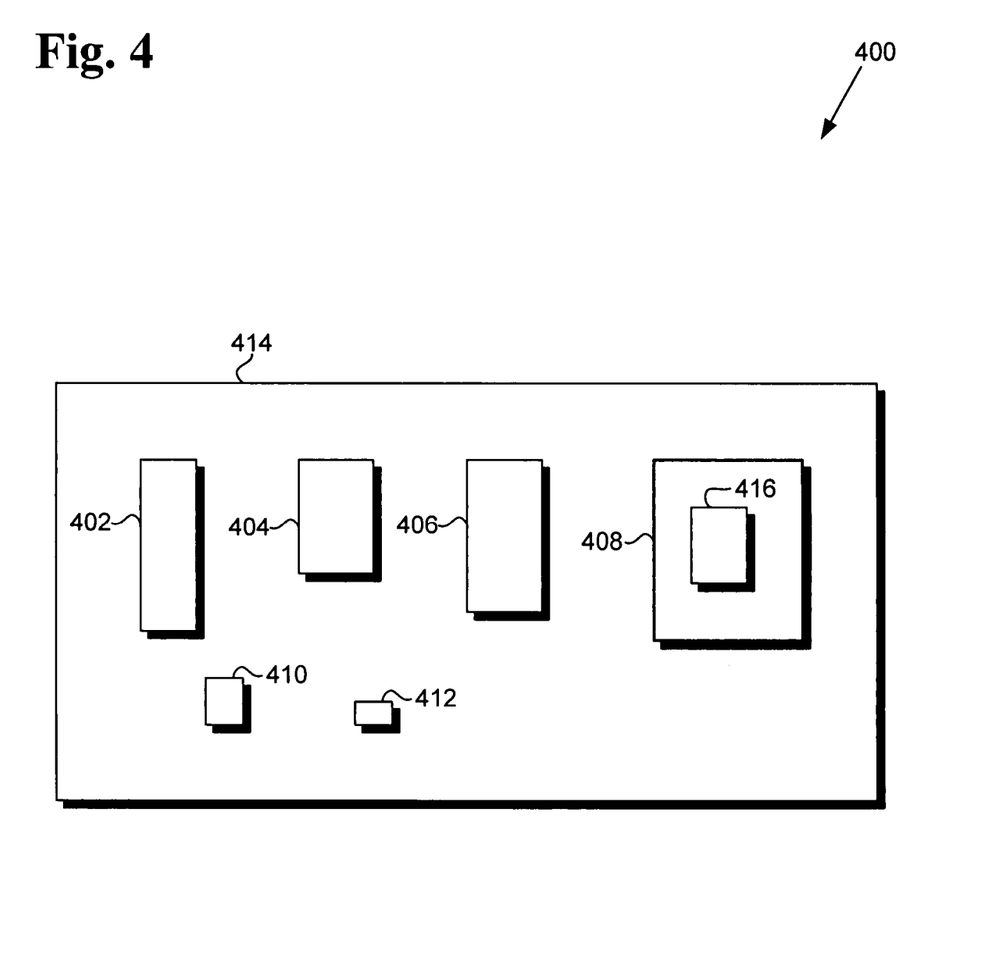
FIG. 4 is a diagram of an exemplary electronic system including an exemplary chip or die fabricated using a method for depositing a conductive capping layer on metal lines, in accordance with one or more embodiments of the present invention.

FIG. 4 is a diagram of an exemplary electronic system including an exemplary chip or die fabricated by using the present invention's method for depositing a conductive capping layer on metal lines, in accordance with one or more embodiments of the present invention. Electronic system 400 includes exemplary modules 402, 404, and 406, IC chip 408, discrete components 410 and 412, residing in and interconnected through circuit board 414. In one embodiment, electronic system 400 may include more than one circuit board. IC chip 408 can comprise a semiconductor die, which is fabricated by using an embodiment of the invention's method for depositing a conductive capping layer on metal lines. IC chip 408 includes circuit 416, which can be a microprocessor, for example.

As shown in FIG. 4, modules 402, 404, and 406 are mounted on circuit board 414 and can each be, for example, a central processing unit (CPU), a graphics controller, a digital signal processor (DSP), an application specific integrated circuit (ASIC), a video processing module, an audio processing module, an RF receiver, an RF transmitter, an image sensor module, a power control module, an electro-mechanical motor control module, or a field programmable gate array (FPGA), or any other kind of module utilized in modern electronic circuit boards. Circuit board 414 can include a number of interconnect traces (not shown in FIG. 4) for interconnecting modules 402, 404, and 406, discrete components 410 and 412, and IC chip 408.

Also shown in FIG. 4, IC chip 408 is mounted on circuit board 414 and can comprise, for example, any semiconductor die that is fabricated by utilizing an embodiment of the invention's method for depositing a conductive capping layer on metal lines. In one embodiment, IC chip 408 may not be mounted on circuit board 414, and may be interconnected with other modules on different circuit boards. Further shown in FIG. 4, discrete components 410 and 412 are mounted on circuit board 414 and can each be, for example, a discrete filter, such as one including a BAW or SAW filter or the like, a power amplifier or an operational amplifier, a semiconductor device, such as a transistor or a diode or the like, an antenna element, an inductor, a capacitor, or a resistor.

Electronic system 400 can be utilized in, for example, a wired communications device, a wireless communications device, a cell phone, a switching device, a router, a repeater, a codec, a LAN, a WLAN, a Bluetooth enabled device, a digital camera, a digital audio player and/or recorder, a digital video player and/or recorder, a computer, a monitor, a television set, a satellite set top box, a cable modem, a digital automotive control system, a digitally-controlled home appliance, a printer, a copier, a digital audio or video receiver, an RF transceiver, a personal digital assistant (PDA), a digital game playing device, a digital testing and/or measuring device, a digital avionics device, a medical device, or a digitally-controlled medical equipment, or in any other kind of system, device, component or module utilized in modern electronics applications.

Thus, the invention's method for depositing a conductive capping layer on metal lines advantageously enables formation of a conductive capping layer providing high resistance to electromigration, while avoiding the leakage currents and shorting between adjacent lines seen in conventional approaches for preventing electromigration. By applying a voltage to metal lines during a selective deposition process, the present method enhances the selectivity of that deposition process, resulting in little or no accumulation of capping material between the metal lines being covered. Because it enables deposition of a conductive capping layer over metal lines, thereby substantially resolving electromigration concerns, the present method provides increased flexibility in selection of a blanket passivation layer utilized for further fabrication of a semiconductor substrate. Consequently, the present method improves the efficiency and cost effectiveness of, for example, semiconductor wafer fabrication.

From the above description of the invention it is manifest that various techniques can be used for implementing the concepts of the present invention without departing from its scope. Moreover, while the invention has been described with specific reference to certain embodiments, a person of ordinary skill in the art would appreciate that changes can be made in form and detail without departing from the spirit and the scope of the invention. Thus, the described embodiments are to be considered in all respects as illustrative and not restrictive. It should also be understood that the invention is not limited to the particular embodiments described herein but is capable of many rearrangements, modifications, and substitutions without departing from the scope of the invention.

Thus, a method for depositing a conductive capping layer on metal lines has been described.

The invention claimed is:

1. A method for depositing a conductive capping layer on a plurality of metal lines, said method comprising the steps of:
   forming said plurality of metal lines on a dielectric layer;
   applying a voltage across said plurality of metal lines and said dielectric layer with reference to a ground node;
   depositing said conductive capping layer on said plurality of metal lines, wherein no portion of said conductive capping layer is deposited on sidewalls of said plurality of metal lines, and wherein said voltage increases a selectivity of said depositing step and prevents said conductive capping layer from shorting said plurality of metal lines.

2. The method of claim 1 wherein said depositing step comprises utilizing a process selected from the group consisting of an electroplating process and an electroless process.

3. The method of claim 1 wherein said depositing step comprises utilizing a process selected from the group consisting of a chemical vapor deposition (CVD) process, a physical vapor deposition (PVD) process, and an atomic layer deposition (ALD) process.

4. The method of claim 1 wherein said voltage can be selected from the group consisting of a steady DC voltage and a pulsed DC voltage.

5. The method of claim 1 wherein said plurality of metal lines comprise copper.

6. The method of claim 1 wherein said conductive capping layer comprises a metal selected from the group consisting of tantalum and cobalt.

7. The method of claim 1 further comprising forming a blanket passivation layer over said conductive capping layer.

8. The method of claim 7 wherein said blanket passivation layer comprises a low-k dielectric material.

9. A method for fabricating a semiconductor wafer, said method comprising the steps of:
   forming a plurality of metal lines on a dielectric layer formed over said semiconductor wafer;
   applying a voltage across said plurality of metal lines and said dielectric layer with reference to a ground node;
   depositing a conductive capping layer on said plurality of metal lines, wherein said voltage increases a selectivity of said depositing step, thereby preventing said conductive capping layer to cause a short between said plurality of metal lines.

10. The method of claim 9 wherein said depositing step comprises utilizing an electroplating process.

11. The method of claim 9 wherein said depositing step comprises utilizing an atomic layer deposition (ALD) process.

12. The method of claim 9 wherein said depositing step comprises utilizing a chemical vapor deposition (CVD) process.

13. The method of claim 9 wherein said plurality of metal lines comprise copper lines.

14. The method of claim 9 wherein said conductive capping layer comprises a metal selected from the group consisting of tantalum and cobalt.

15. The method of claim 9 further comprising forming a blanket passivation layer over said conductive capping layer.

16. The method of claim 15 wherein said blanket passivation layer comprises a low-k dielectric material.

17. The method of claim 9 further comprising separating said semiconductor wafer into a plurality of semiconductor dies.

18. The method of claim 17 further comprising packaging one or more of said plurality of semiconductor dies.

19. The method of claim 17 further comprising utilizing one or more of said plurality of semiconductor dies in a circuit board.

20. The method of claim 17 further comprising utilizing one or more of said plurality of semiconductor dies in a circuit board as a part of an electronic system, said electronic system being selected from the group consisting of a wired communications device, a wireless communications device, a cell phone, a switching device, a router, a repeater, a codec, a LAN, a WLAN, a Bluetooth enabled device, a digital camera, a digital audio player and/or recorder, a digital video player and/or recorder, a computer, a monitor, a television set, a satellite set top box, a cable modem, a digital automotive control system, a digitally-controlled home appliance, a printer, a copier, a digital audio or video receiver, an RF transceiver, a personal digital assistant (PDA), a digital game playing device, a digital testing and/or measuring device, a digital avionics device, a medical device, and a digitally-controlled medical equipment.

* * * * *